US012563676B2

(12) United States Patent
Sawadaishi

(10) Patent No.: US 12,563,676 B2
(45) Date of Patent: Feb. 24, 2026

(54) COMPOSITE WIRING BOARD

(71) Applicant: TOPPAN INC., Tokyo (JP)

(72) Inventor: Masashi Sawadaishi, Tokyo (JP)

(73) Assignee: TOPPAN INC., Tokyo (JP)

( * ) Notice: Subject to any disclaimer, the term of this patent is extended or adjusted under 35 U.S.C. 154(b) by 71 days.

(21) Appl. No.: 18/360,977

(22) Filed: Jul. 28, 2023

(65) Prior Publication Data

US 2023/0371186 A1    Nov. 16, 2023

Related U.S. Application Data

(63) Continuation of application No. PCT/JP2022/004207, filed on Feb. 3, 2022.

(30) Foreign Application Priority Data

Feb. 5, 2021    (JP) ................................. 2021-017648

(51) Int. Cl.
*H05K 3/36* (2006.01)
*H05K 1/14* (2006.01)
*H05K 3/46* (2006.01)

(52) U.S. Cl.
CPC ............. *H05K 3/361* (2013.01); *H05K 1/147* (2013.01); *H05K 3/4644* (2013.01); *H05K 2201/10674* (2013.01); *H05K 2201/10734* (2013.01)

(58) Field of Classification Search
CPC ...... H05K 3/361; H05K 3/4644; H05K 1/147; H05K 2201/10674; H05K 2201/10734
USPC ........................................................ 174/255
See application file for complete search history.

(56) References Cited

U.S. PATENT DOCUMENTS

| | | | | |
|---|---|---|---|---|
| 8,119,920 | B2* | 2/2012 | Inagaki | .................. H05K 1/144 |
| | | | | 174/262 |
| 2006/0171627 | A1* | 8/2006 | Aoki | .................... G02B 6/1221 |
| | | | | 385/14 |
| 2019/0099997 | A1* | 4/2019 | Hirai | ........................ H01L 25/16 |
| 2020/0006181 | A1 | 1/2020 | Chen et al. | |

(Continued)

FOREIGN PATENT DOCUMENTS

| | | |
|---|---|---|
| JP | 2002-280490 A | 9/2002 |
| JP | 2014-225671 A | 12/2014 |
| JP | 2018-131590 A | 8/2018 |

(Continued)

OTHER PUBLICATIONS

European Extended Search Report issued in corresponding European Patent Application No. 22749777.3 dated Jul. 15, 2024 (10 pages).

*Primary Examiner* — Andargie M Aychillhum
(74) *Attorney, Agent, or Firm* — Foley & Lardner LLP

(57) ABSTRACT

A wiring board that facilitates narrowing a pitch of bonding terminals used for bonding to a semiconductor chip, providing finer wiring in a substrate and reducing cost, and is capable of achieving high connection reliability. A composite wiring board includes: a first wiring board; a second wiring board facing the first wiring board and bonded to the first wiring board, a distance from the second wiring board to the first wiring board being greater at a peripheral part than at a center part of the second wiring board; and a sealing resin layer interposed between the first wiring board and the second wiring board, the sealing resin layer covering an end face of the second wiring board.

17 Claims, 10 Drawing Sheets

(56)     References Cited

U.S. PATENT DOCUMENTS

| 2021/0007220 | A1 | 1/2021 | Kobayashi et al. |
| 2022/0078921 | A1 | 3/2022 | Nitta et al. |

FOREIGN PATENT DOCUMENTS

| JP | 2021009938 | A | * | 1/2021 |
| WO | WO-2018/047861 | A1 | | 3/2018 |
| WO | WO-2020/235684 | A1 | | 11/2020 |

* cited by examiner

FIG.1

COMPOSITE WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/004207, filed on Feb. 3, 2022, which in turn claims the benefit of JP 2021-017648, filed Feb. 5, 2021, the disclosures of which are all incorporated herein by reference in its entirety.

TECHNICAL FIELD

The present invention relates to composite wiring boards.

BACKGROUND

In recent years, as semiconductor devices are becoming faster and more highly integrated, wiring boards for flip chip-ball grid arrays on which semiconductor chips are mounted, that is, FC-BGA substrates, are also required to have a narrower pitch of bonding terminals used for bonding to semiconductor chips and have finer wiring in the substrate. Meanwhile, the FC-BGA substrates are required to be bonded to a motherboard with bonding terminals arranged at substantially the same pitch as that of related art. In view of these demands, a technique of disposing a multilayer wiring board including fine wiring, which is also called an interposer, between the FC-BGA substrate and the semiconductor chip is being adopted.

The above includes a silicon interposer technology. In the silicon interposer technology, an interposer is manufactured by forming a multilayer wiring structure, in which respective layers include fine wiring, on a silicon wafer using a semiconductor circuit manufacturing technology. This is disclosed in PTL 1.

A technique has also been developed in which the above-mentioned multilayer wiring structure is formed not on a silicon wafer, but directly on an FC-BGA substrate. According to this technique, the above-mentioned multilayer wiring structure is formed by chemical mechanical polishing (CMP) or the like in manufacture of an FC-BGA substrate whose core layer is formed of a glass epoxy substrate, for example. This is disclosed in PTL 2.

Further, there is also a method (hereinafter, "transfer method") in which the above-mentioned multilayer wiring structure is formed on an FC-BGA substrate by forming an interposer on a support such as a glass substrate, bonding the interposer to an FC-BGA substrate, and removing the support from the interposer. This is disclosed in PTL 3.

CITATION LIST

[Patent Literature] PTL 1: JP 2002-280490 A; PTL 2: JP 2014-225671 A; PTL 3: WO 2018/047861 A.

SUMMARY OF THE INVENTION

An object of the present invention is to provide a wiring board that facilitates narrowing a pitch of bonding terminals used for bonding to a semiconductor chip, providing finer wiring in a substrate and reducing cost, and is capable of achieving high connection reliability.

According to an aspect of the present invention, there is provided a composite wiring board including: a first wiring board; a second wiring board facing the first wiring board and bonded to the first wiring board, a distance from the second wiring board to the first wiring board being greater at a peripheral part than at a center part of the second wiring board; and a sealing resin layer interposed between the first wiring board and the second wiring board, the sealing resin layer covering an end face of the second wiring board.

According to another aspect of the present invention, there is provided a composite wiring board according to the above aspect in which the second wiring board is bent with the center part protruding toward the first substrate more than the peripheral part does.

According to still another aspect of the present invention, there is provided a composite wiring board according to any of the above aspects in which a difference between the distance from the first wiring board to the peripheral part and the distance from the first wiring board to the center part is in a range of 5 μm or more and 30 μm or less.

According to still another aspect of the present invention, there is provided a composite wiring board according to any of the above aspects in which the second wiring board includes two or more layers laminated together, each of the two or more layers include an insulating layer made of a material containing an organic insulator, the insulating layer being provided with recesses, and a conductor layer disposed on the insulating layer, the conductor layer filling the recesses.

According to still another aspect of the present invention, there is provided a composite wiring board according to any of the above aspects in which a distance from an edge of a surface of the second wiring board facing the first wiring board to a multilayer wiring structure formed of the conductor layer included in the two or more layers is 100 μm or more.

According to still another aspect of the present invention, there is provided a composite wiring board according to the above aspect in which the distance from the edge to the multilayer wiring structure is 1,000 μm or less.

According to still another aspect of the present invention, there is provided a composite wiring board according to any of the above aspects in which the second wiring board has a thickness in a range of 20 μm or more and 100 μm or less.

According to still another aspect of the present invention, there is provided a composite wiring board according to any of the above aspects in which the peripheral part has a flexural modulus in a range of 1.5 GPa or more and 20 GPa or less.

The term "flexural modulus" as used herein refers to a value obtained in accordance with the method defined in JIS K 7171:2016 "Plastics—Determination of flexural properties."

According to still another aspect of the present invention, there is provided a composite wiring board according to any of the above aspects in which the sealing resin layer has a coefficient of linear expansion in a range of 20 ppm/° C. or more and 35 ppm/° C. or less.

According to still another aspect of the present invention, there is provided a composite wiring board according to any of the above aspects in which the first wiring board is a wiring board for a flip chip ball grid array, and the second wiring board is an interposer.

According to still another aspect of the present invention, there is provided a packaged device including: the composite wiring board according to any of the above aspects; and a functional device mounted on a surface of the second wiring board opposite to that facing the first wiring board.

The term "functional device" as used herein refers to a device that operates by being supplied with at least one of electric power and electrical signals, a device that outputs at least one of electric power and electrical signals in response to external stimuli, or a device that operates by being supplied with at least one of electric power and electrical signals and outputs at least one of electric power and electrical signals in response to external stimuli. The functional device is in the form of a chip, and may be, for example, a semiconductor chip or a chip in which circuits or elements are formed on a substrate made of a material other than a semiconductor, such as a glass substrate. The functional device may include, for example, one or more of a large-scale integrated circuit (LSI), a memory, an imaging element, a light emitting element, and micro electro mechanical systems (MEMS). The MEMS may be, for example, one or more of a pressure sensor, an acceleration sensor, a gyro sensor, a tilt sensor, a microphone, and an acoustic sensor. According to an example, the functional device is a semiconductor chip including an LSI.

According to still another aspect of the present invention, there is provided a method of producing a composite wiring board, the method including the steps of: bonding a first wiring board and a second wiring board facing each other; and injecting a sealing resin into a gap between the first wiring board and the second wiring board to form a sealing resin layer interposed between the first wiring board and the second wiring board and covering an end face of the second wiring board to thereby bend the second wiring board with a center part protruding toward the first wiring board more than a peripheral part does.

According to still another aspect of the present invention, there is provided a method of producing a composite wiring board according to the above aspect in which the step of bonding the first wiring board and the second wiring board includes a step of transferring the second wiring board, which is removably supported by a support, from the support to the first wiring board.

According to still another aspect of the present invention, there is provided a method of producing a composite wiring board, the method including the steps of: superimposing a first wiring board and a second wiring board with a sealing resin interposed therebetween; and pressing the first wiring board and the second wiring board in a superimposed state against each other to form a sealing resin layer interposed between the first wiring board and the second wiring board and covering an end face of the second wiring board to thereby bend the second wiring board with a center part protruding toward the first wiring board more than a peripheral part does.

According to still another aspect of the present invention, there is provided a method of producing a composite wiring board according to the above aspect in which the step of superimposing the first wiring board and the second wiring board includes a step of transferring the second wiring board, which is removably supported by a support, from the support to the first wiring board.

BRIEF DESCRIPTION OF THE DRAWINGS

FIG. 1 is a cross-sectional view schematically illustrating a packaged device according to an embodiment of the present invention.

DETAILED DESCRIPTION

Figure 2:
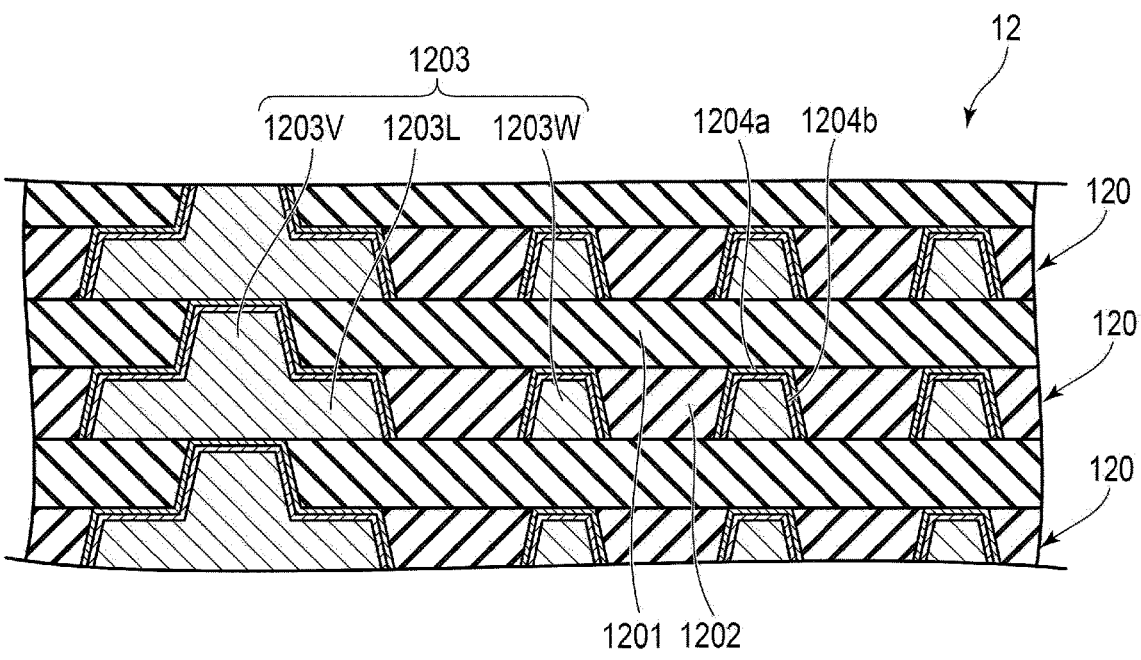
FIG. 2 is a cross-sectional view schematically illustrating an example structure that can be adopted for a second wiring board included in the packaged device shown in FIG. 1.

With reference to the drawings, some embodiments of the present invention will be described. The embodiments described below are more specific examples of any of the aspects described above. The embodiments described below are merely examples for embodying the technical idea of the present invention, and should not limit the technical idea of the present invention to the materials, shapes, structures, arrangements, and the like of the components described below. The technical idea of the present invention can be modified in various manners within the technical scope defined by the claims.

In the drawings referred to in the following description, components having the same or similar functions are denoted by the same reference signs. It should be noted that the drawings are schematic, and the relationship between dimensions in the thickness direction and dimensions in a direction perpendicular to the thickness direction, that is, in an in-plane direction, and the relationship between dimensions of a plurality of layers in the thickness direction may not be to scale. Therefore, specific dimensions should be understood in view of the following description. It should also be noted that the dimensional relationships between two or more components may differ among the drawings. In addition, it should also be noted that some drawings show the same structure inverted from other drawings.

In the present disclosure, "upper surface" and "lower surface" refer to two major surfaces of a plate-shape member or a layer included therein, that is, a surface perpendicular to the thickness direction and having the largest surface area and a rear surface thereof, which are the surfaces illustrated on the upper side and the lower side of the drawings, respectively. Further, "side surface" refers to a surface perpendicular to or inclined relative to the in-plane direction.

In the present disclosure, the description "AA is on the BB" is used regardless of the direction of gravity. The situation specified by the description "AA is on the BB" encompasses the situation in which AA is in contact with BB. The description "AA is on the BB" does not exclude that one or more components are interposed between AA and BB.

<Structure>

Figure 1:
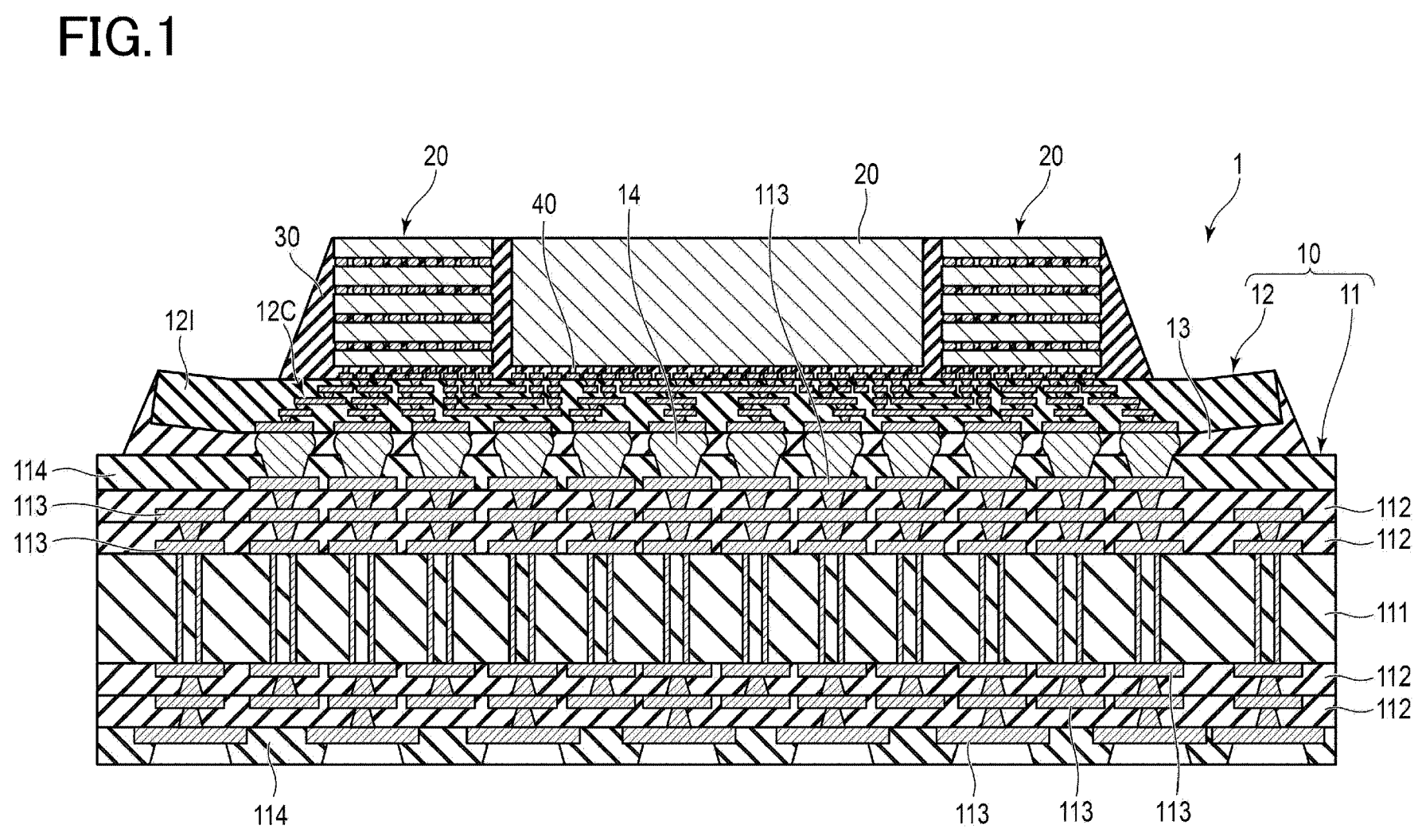

FIG. 1 is a cross-sectional view schematically illustrating a packaged device according to an embodiment of the present invention.

A packaged device 1 shown in FIG. 1 includes a composite wiring board 10, a functional device 20, sealing resin layer 30 and bonding electrodes 40.

The functional device 20 may be, for example, a semiconductor chip or a chip in which circuits or elements are formed on a substrate made of a material other than a semiconductor, such as a glass substrate. As an example, the functional device 20 is assumed to be a semiconductor chip. That is, the packaged device 1 described herein is a semiconductor package.

The packaged device 1 includes a plurality of functional devices 20. The packaged device 1 may include a single functional device 20.

The functional devices 20 are bonded to the composite wiring board 10 via the bonding electrodes 40. In this example, the functional devices 20 are bonded to the composite wiring board 10 by flip chip bonding. One or more functional devices 20 may be bonded to the composite wiring board 10 by other bonding methods, such as wire bonding.

The bonding electrodes 40 are arranged at a narrow pitch between the functional device 20 and the composite wiring board 10. The bonding electrodes 40 may be made of, for example, a metal such as solder, copper or gold, or an alloy. When one or more functional devices 20 are bonded to the composite wiring board 10 by wire bonding, the functional devices 20 may be electrically connected to the composite wiring board using gold wires, for example.

The sealing resin layer 30 includes a portion interposed between the functional device 20 and the composite wiring board 10, and a portion at least partially covering a side surface of the functional device 20. The sealing resin layer 30 fixes the functional device 20 to the composite wiring board 10.

The composite wiring board 10 includes an FC-BGA substrate 11, a multilayer wiring board 12, a sealing resin layer 13 and bonding electrodes 14.

The FC-BGA substrate 11 is an example of a first wiring board. The FC-BGA substrate 11 may be bonded to, for example, a motherboard (not shown).

The FC-BGA substrate 11 includes a core layer 111, an insulating layer 112, a conductor layer 113 and an insulating layer 114.

The core layer 111 is an insulating layer. The core layer 111 may be, for example, a fiber-reinforced substrate obtained by impregnating a woven or nonwoven fabric with a thermosetting insulating resin. As the woven or nonwoven fabric, for example, glass fibers, carbon fibers or aramid fibers may be used. As the insulating resin, for example, an epoxy resin may be used.

The core layer 111 is provided with through holes. A part of the conductor layer 113 covers a side wall of the through holes. In this example, a part of the conductor layer 113 covers the side wall of the through holes disposed in the core layer 111 such that the through holes are formed to have a side wall made of a conductor. The through holes whose side wall is made of a conductor may be filled with an insulator.

The other parts of the conductor layer 113 form a multilayer wiring structure on both major surfaces of the core layer 111. The multilayer wiring structure includes a plurality of conductor layers 113 laminated together.

Each insulating layer 112 included in the multilayer wiring structure is interposed between two adjacent conductor layers 113. The insulating layer 112 may be, for example, an insulating resin layer. The insulating layer 112 is provided with through holes.

The conductor layer 113 is made of a metal such as copper, or an alloy. The conductor layer 113 may have a monolayer structure or a multilayer structure.

Each conductor layer 113 included in the multilayer wiring structure includes wiring portions and land portions. The conductor layer 113 facing the core layer 111 with the insulating layer 112 therebetween further includes via portions that cover the side wall of the through holes formed in the insulating layer 112.

The insulating layer 114 is disposed on a laminate of the conductor layer 113 and the insulating layer 112. The insulating layer 114 may be, for example, an insulating resin layer such as a solder resist. The insulating layer 114 is provided with through holes communicating with the conductor layer 113 located on the uppermost surface of the multilayer wiring structure.

The FC-BGA substrate 11 may further include bonding conductors on portions of the conductor layer 113 exposed at the positions of the through holes of the insulating layer 114. The bonding conductors may be, for example, metal bumps disposed on the portions of the conductor layer 113 exposed at the positions of the through holes of the insulating layer 114. The bonding conductors may also be referred to as bonding terminals. The bonding conductors may be formed of solder, for example.

The multilayer wiring board 12 is a second wiring board. The multilayer wiring board 12 is bonded to the functional device 20 via the bonding electrodes 40 with the upper surface of the multilayer wiring board 12 facing the functional device 20. Further, the multilayer wiring board 12 is bonded to the FC-BGA substrate 11 via the bonding electrodes 14 with the lower surface of the multilayer wiring board 12 facing the FC-BGA substrate 11. That is, the multilayer wiring board 12 is an interposer which serves to bond the functional device 20 and the FC-BGA substrate 11 to each other.

The multilayer wiring board 12 is smaller in size than the FC-BGA substrate 11. Further, the multilayer wiring board 12 is larger in size than the functional device 20. Specifically, the orthogonal projection of the multilayer wiring board 12 onto a plane perpendicular to the thickness direction of the FC-BGA substrate 11 is surrounded by the outline of the orthogonal projection of the FC-BGA substrate 11 onto the plane. Further, the orthogonal projection of multilayer wiring board 12 onto the plane surrounds the orthogonal projection of the functional device 20 onto the plane. The details of the multilayer wiring board 12 will be described later.

The bonding electrodes 14 are arranged between the multilayer wiring board 12 and the functional device 20. The pitch of the bonding electrodes 14 is larger than the pitch of the bonding electrodes 40 and smaller than the pitch of the bonding conductors provided on the lower surface of the FC-BGA substrate 11. The bonding electrodes 14 may be formed of solder, for example.

The sealing resin layer 13 includes a portion interposed between the FC-BGA substrate 11 and the multilayer wiring board 12. The sealing resin layer may also be referred to as an underfill layer. The sealing resin layer 13 fixes the multilayer wiring board 12 to the FC-BGA substrate 11.

With reference to FIGS. 1 and 2, further details of the multilayer wiring board 12 will be described.

FIG. 2 is a cross-sectional view schematically illustrating an example structure that can be adopted for the multilayer wiring board included in the packaged device shown in FIG. 1.

The multilayer wiring board 12 shown in FIG. 2 includes two or more layers 120 laminated together. Each of the layers 120 includes an insulating layer made of a material containing an organic insulator, the insulating layer being provided with recesses, and a conductor layer 1203 disposed on the insulating layer, the conductor layer filling the recesses. The insulating layer described above is a combination of a first insulating layer 1201 and a second insulating layer 1202. In addition, each layer 120 further includes an adhesive layer 1204a and a seed layer 1204b. Hereinafter, the insulating layer made of a material containing an organic insulator may also be referred to as an "organic insulating layer."

A laminate in which the first insulating layers 1201 and the second insulating layers 1202 are alternately laminated constitutes an insulating layer 121 shown in FIG. 1. Further, a laminate of the conductor layers 1203 shown in FIG. 2 constitutes a multilayer wiring structure 12C shown in FIG. 1.

The first insulating layer 1201 shown in FIG. 2 has, as part of the recesses described above, first through holes in which the via portion 1203V is formed. The second insulating layer 1202 has, as another part of the recesses described above, one or more second through holes communicating with the first through holes and in which a land portion 1203L is formed, and grooves communicating with the second through holes and in which a wiring portion 1203W is formed. The bottom of the grooves of the second insulating layer 1202 included in each layer 120 is part of the surface of the first insulating layer 1201 included in the layer 120.

The first insulating layer 1201 and the second insulating layer 1202 may be made of, for example, a material containing an organic insulator. The materials of the first insulating layer 1201 and the second insulating layer 1202 may be an inorganic material, but preferably include an organic material. According to one example, the first insulating layer 1201 and the second insulating layer 1202 are insulating resin layers. These insulating resin layers preferably contain no filler. The materials of the first insulating layer 1201 and the second insulating layer 1202 may be the same or may be different. Even when the materials of the first insulating layer 1201 and the second insulating layer 1202 are the same, the interface between the first insulating layer 1201 and the second insulating layer 1202 can be identified by observing a cross-section parallel to the thickness direction with a scanning electron microscope, for example.

The conductor layer 1203 fills the first and second through holes and the grooves. The upper surface and the lower surface of the conductor layer 1203 are flush with the upper surface of the first insulating layer 1201 and the lower surface of the second insulating layer 1202, respectively.

A portion of the conductor layer 1203 that fills the first through hole is the via portion 1203V. A portion of the conductor layer 1203 that fills the second through hole is the land portion 1203L. A portion of the conductor layer 1203 that fills the groove is the wiring portion 1203W.

The conductor layer 1203 is made of a metal such as copper, or an alloy. The conductor layer 1203 may have a monolayer structure or a multilayer structure.

The adhesive layer 1204a includes a portion interposed between the conductor layer 1203 and the first insulating layer 1201, a portion interposed between the conductor layer 1203 and the second insulating layer 1202, and a portion covering the upper surface of the conductor layer 1203. The adhesive layer 1204a is a layer that improves adhesion of the first and second insulating layers 1201 and 1202 to the seed layer 1204b so that the seed layer 1204b is not easily detached.

The seed layer 1204b is disposed on the adhesive layer 1204a. The seed layer 1204b is interposed between the adhesive layer 1204a and the conductor layer 1203. The seed layer 1204b serves as a power supply layer in film formation of the conductor layer 1203 by electroplating.

The above packaged device 1 has a structure described below.

Figure 3:
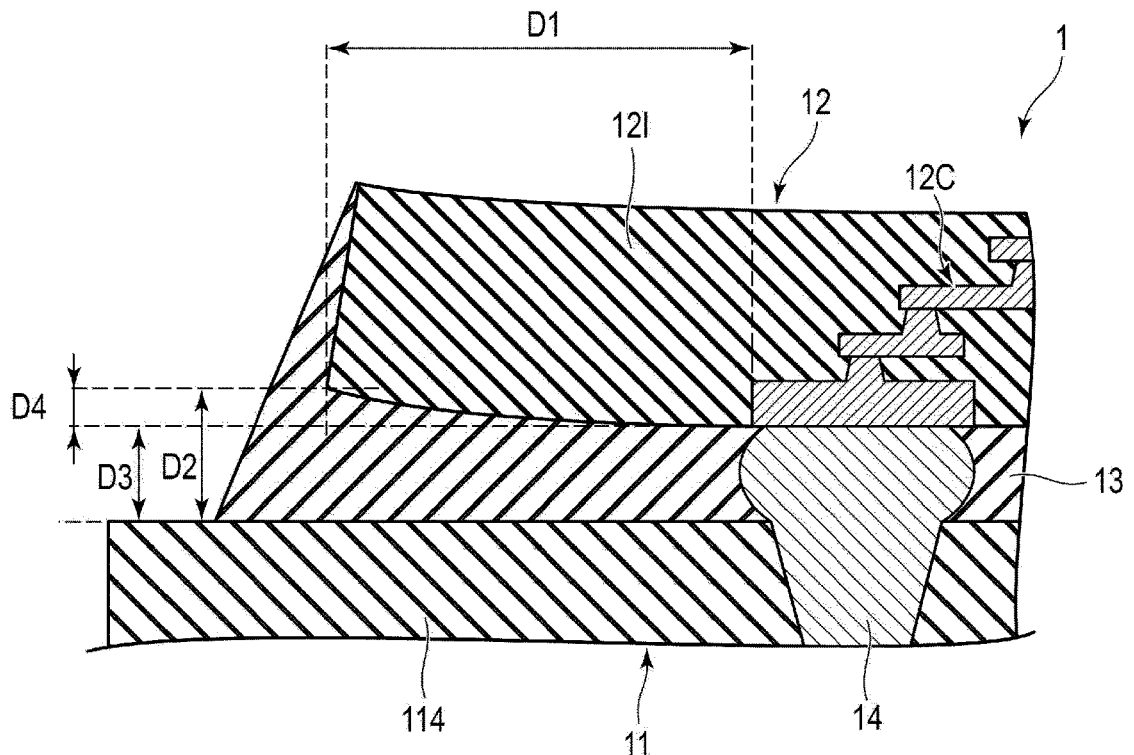
FIG. 3 is an enlarged cross-sectional view of a part of the packaged device shown in FIG. 1.

FIG. 3 is an enlarged cross-sectional view of a part of the packaged device shown in FIG. 1.

As shown in FIGS. 1 and 3, the distance from the multilayer wiring board 12 to the FC-BGA substrate 11 is greater at the peripheral part than at the center part of the multilayer wiring board 12. The upper surface of the FC-BGA substrate 11 is flat. The multilayer wiring board 12 is bent such that the center part protrudes toward the FC-BGA substrate 11 more than the peripheral part does.

Specifically, a first portion of the multilayer wiring board 12 in which the multilayer wiring structure 12C is disposed is not deformed, and a surface of the first portion facing the FC-BGA substrate 11 is flat. On the other hand, a portion of the multilayer wiring board 12 in which no multilayer wiring structure 12C is disposed, that is, a second portion of the multilayer wiring board 12 which surrounds the first portion is deformed such that a distance from the FC-BGA substrate 11 increases with an increase in the distance from the first portion.

As will be described later, according to the above structure, the multilayer wiring board 12 is less likely to be damaged, and thus achieves high connection reliability.

The thickness of the multilayer wiring board 12 is preferably in a range of 20 μm or more and 100 μm or less, and more preferably in a range of 25 μm or more and 60 μm or less. When the multilayer wiring board 12 is thin, it is difficult to obtain a multilayer wiring structure 12C having a sufficient number of conductor layers 1203.

The peripheral part of the multilayer wiring board 12 preferably has a flexural modulus in a range of 1.5 GPa or more and 20 GPa or less, and more preferably in a range of 2 GPa or more and 15 GPa or less. The smaller the flexural modulus, the easier it is to bend the multilayer wiring board 12 so that the center part of the multilayer wiring board 12 protrudes toward the FC-BGA substrate 11 more than the peripheral part does. When the flexural modulus is too small, the shape of the multilayer wiring board 12 tends to vary.

A distance D1 from an edge of the surface of the multilayer wiring board 12 facing the FC-BGA substrate 11 to the multilayer wiring structure 12C is preferably 100 μm or more, and more preferably 500 μm or more. The distance D1 is preferably 1,000 μm or less, and more preferably 700 μm or less. The distance D1 is a distance from the edge to the multilayer wiring structure 12C in a direction perpendicular to the thickness direction of the composite wiring board 10. The multilayer wiring board 12 with a small distance D1 is difficult to bend. When the distance D1 is sufficiently large, further improvement in connection reliability accompanying further increase in the distance D1 is small. Most preferably, the distance D1 is approximately 500 μm.

A difference D4 between a distance D2 from the FC-BGA substrate 11 to the peripheral part of the multilayer wiring board 12 and the distance D3 from the FC-BGA substrate 11 to the center part of the multilayer wiring board 12 is preferably in a range of 5 μm or more and 30 μm or less, and more preferably 10 μm or more and 25 μm or less. For improvement in connection reliability, it is advantageous to increase the difference D4. However, as the difference D4 increases, the flatness of the multilayer wiring board 12 decreases.

The distance D3 from the FC-BGA substrate 11 to the center part of the multilayer wiring board 12 may be in a range of, for example, 50 μm or more and 150 μm or less. Further, an angle formed by a portion near the edge of the multilayer wiring board 12 facing the FC-BGA substrate 11 and a plane perpendicular to the thickness direction of the composite wiring board 10 may be, for example, in a range of 5° or more and 30° or less.

The material constituting the organic insulating layers included in the insulating layer 121, for example, the first insulating layer 1201 and the second insulating layer 1202, preferably has a coefficient of linear expansion in a range of 40 ppm/° C. or more and 65 ppm/° C. or less, and the material constituting the sealing resin layer 13 preferably has a coefficient of linear expansion in a range of 20 ppm/° C. or more and 35 ppm/° C. or less. The coefficient of linear expansion of the material constituting the organic insulating layers included in the insulating layer 121 is preferably larger than the coefficient of linear expansion of the material constituting the sealing resin layer 13. In this case, detachment of the multilayer wiring board 12 from the FC-BGA substrate 11 due to thermal expansion is particularly less likely to occur.

<Production Method>

The multilayer wiring board 12 included in the packaged device 1 can be produced by the following method, for example.

FIGS. 4 to 9 are cross-sectional views schematically illustrating a method of producing the packaged device shown in FIG. 1.

(1) Formation of Release Layer 3 on Support 2

Figure 4:
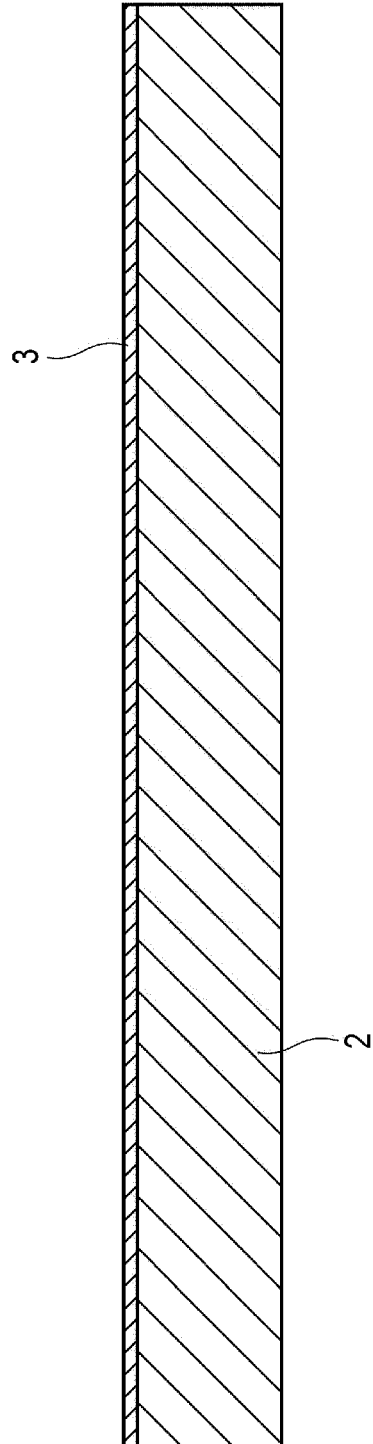
FIG. 4 is a cross-sectional view schematically illustrating a step in a method of producing the packaged device shown in FIG. 1.

In this method, as shown in FIG. 4, a release layer 3 is first formed on one surface of a support 2.

It is advantageous to use a translucent carrier substrate as the support 2 since the release layer 3 may be irradiated with light through the support 2. The support 2 may be, for example, a rectangular glass plate. The rectangular glass plate is suitable for upsizing. Further, the glass plate can achieve excellent flatness and high rigidity. Therefore, the rectangular glass plate as the support 2 is suitable for forming fine patterns thereon.

In addition, since a glass plate has a small coefficient of thermal expansion (CTE) and is less likely to be distorted, it is excellent in ensuring pattern arrangement accuracy and flatness. When a glass plate is used as the support 2, the glass plate is preferably thick from the viewpoint of suppressing the occurrence of warpage in the production process, and the thickness may be in a range of, for example, 0.7 mm or more and 1.1 mm or less.

The CTE of the glass plate is preferably in a range of 3 ppm or more and 15 ppm or less, and more preferably approximately 9 ppm from the viewpoint of consistency with the CTEs of the FC-BGA substrate 11 and the functional device 20.

On the other hand, when the support 2 is not required to be translucent in removal of the support 2, such as when a thermally foamable resin is used for the release layer 3, a material which is less likely to be distorted, such as metal and ceramics, can be used for the support 2. When ceramics are used, a desired CTE can be easily achieved.

In the following description, as an example, a material of the release layer 3 is assumed to be a resin that becomes releasable by absorbing ultraviolet light (UV light), and the support 2 is assumed to be a glass plate.

For example, the release layer 3 may be a resin that becomes releasable by generating heat or being deformed when absorbing light such as UV light, or may be a resin that can be thermally foamed and becomes releasable.

The release layer 3 may further contain additives such as a photodegradation accelerator, a light absorber, a sensitizer and a filler.

The release layer 3 may have a monolayer structure or a multilayer structure. Further, for example, a protective layer may be provided on the release layer 3 for protection of the multilayer wiring structure formed on the support 2, or a layer may be further provided between the support 2 and the release layer 3 to improve adhesion between these. In addition, a laser light reflecting layer or a metal layer may be further provided between the release layer 3 and the multilayer wiring structure.

When a resin that becomes releasable by irradiation of light such as UV light, for example, laser light, is used as the material of the release layer 3, the release layer 3 may be irradiated with light through the support 2 if the support 2 is translucent.

(2) Formation of Multilayer Wiring Board 12 on Release Layer 3

Figure 5:
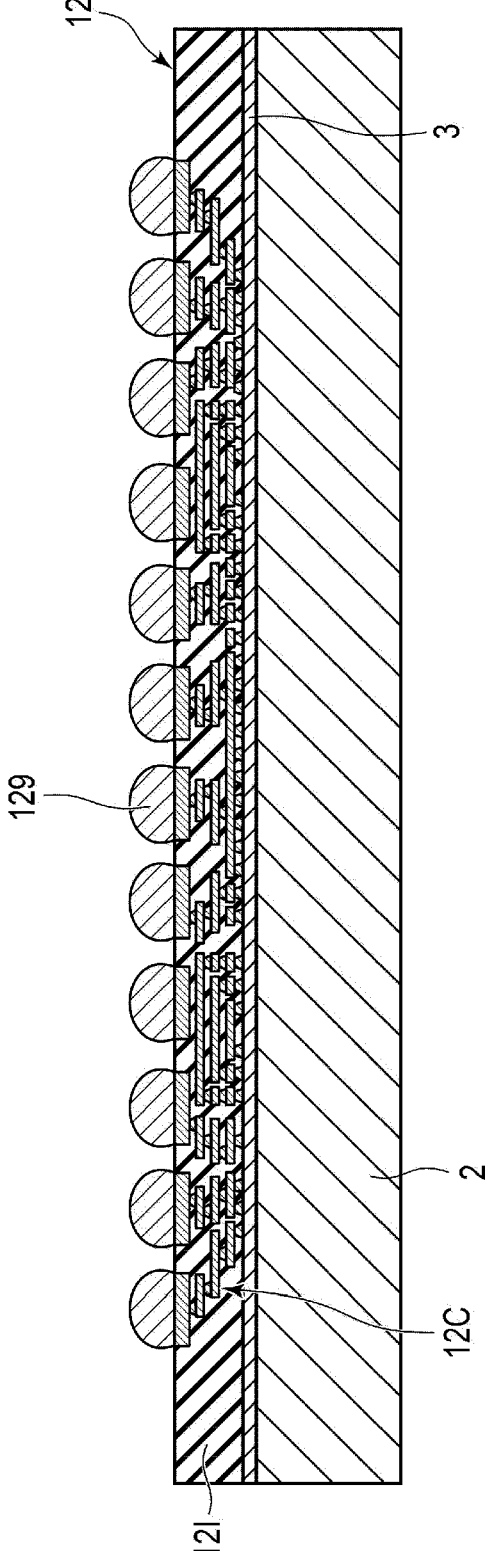
FIG. 5 is a cross-sectional view schematically illustrating another step in the method of producing the packaged device shown in FIG. 1.

As shown in FIG. 5, after the release layer 3 is formed on the upper surface of the support 2, a multilayer wiring board 12 is formed on the release layer 3. The support 2 and a structure including the multilayer wiring board 12 supported by the support 2 is a "multilayer wiring board with a support."

The multilayer wiring board 12 may be formed by, for example, a semi-additive process (SAP) or damascene process.

For example, a photosensitive resin is first applied to the release layer 3 by spin coating. Then, first through holes are formed in the coating film by photolithography to obtain a first insulating layer 1201 shown in FIG. 2.

Then, a second insulating layer 1202 is formed on the first insulating layer 1201. The second insulating layer 1202 may be formed using, for example, a photosensitive resin. For example, a photosensitive resin is applied to a surface of the first insulating layer 1201 by spin coating, and the second insulating layer 1202 having second through holes and grooves is obtained by photolithography.

The photosensitive resin used to form the first insulating layer 1201 and the second insulating layer 1202 is preferably a photosensitive epoxy resin. Since the photosensitive epoxy resin can be cured at a relatively low temperature with little shrinkage, an insulating layer with excellent flatness can be formed, which is advantageous for subsequent fine pattern formation.

The first insulating layer 1201 and the second insulating layer 1202 can be formed by providing an insulating resin film by compression curing with a vacuum laminator instead of by applying a photosensitive resin. In this case, an insulating layer with excellent flatness can be obtained. When high flatness is not required, polyimide may be used.

Then, an adhesive layer 1204*a* and a seed layer 1204*b* are formed in vacuum. The adhesive layer 1204*a* is a layer that improves adhesion of the first and second insulating layers 1201 and 1202 to the seed layer 1204*b* to prevent the seed layer 1204*b* from being detached. The seed layer 1204*b* serves as a power supply layer in electroplating for forming a conductor layer 1203.

As an example, the adhesive layer 1204*a* and the seed layer 1204*b* described herein are formed by sputtering. Further, as an example, a 50 nm thick titanium layer is formed as the adhesive layer 1204*a* and a 300 nm thick copper layer is formed as the seed layer 1204*b*. The seed layer 1204*b* may be formed by electroless plating.

Next, a conductor layer is formed on the seed layer 1204*b* by electroplating. Examples of the electroplating include electrolytic nickel plating, electrolytic copper plating, electrolytic chromium plating, electrolytic Pd plating, electrolytic gold plating, electrolytic rhodium plating and electrolytic iridium plating. Electrolytic copper plating is desirable since it is simple and inexpensive and can provide the conductor layer 1203 with good electrical conductivity.

Next, the above structure is polished by chemical mechanical polishing (CMP) or the like to remove portions of the conductor layer, the seed layer 1204*b* and the adhesive layer 1204*a* located outside the first or second through holes or the grooves. Thus, the conductor layer 1203 is formed and the layer 120 is obtained.

Then, the steps for forming the layer 120 are repeated. Thus, as shown in FIGS. 1, 3 and 5, the multilayer wiring board 12 including the multilayer wiring structure 12C and the insulating layer 121 is obtained.

(3) Production of Composite Wiring Board 10

Next, as shown in FIG. 5, bonding conductors 129 are formed on the exposed portions of the multilayer wiring structure 12C. The bonding conductors 129 may be, for example, solder bumps.

Figure 6:
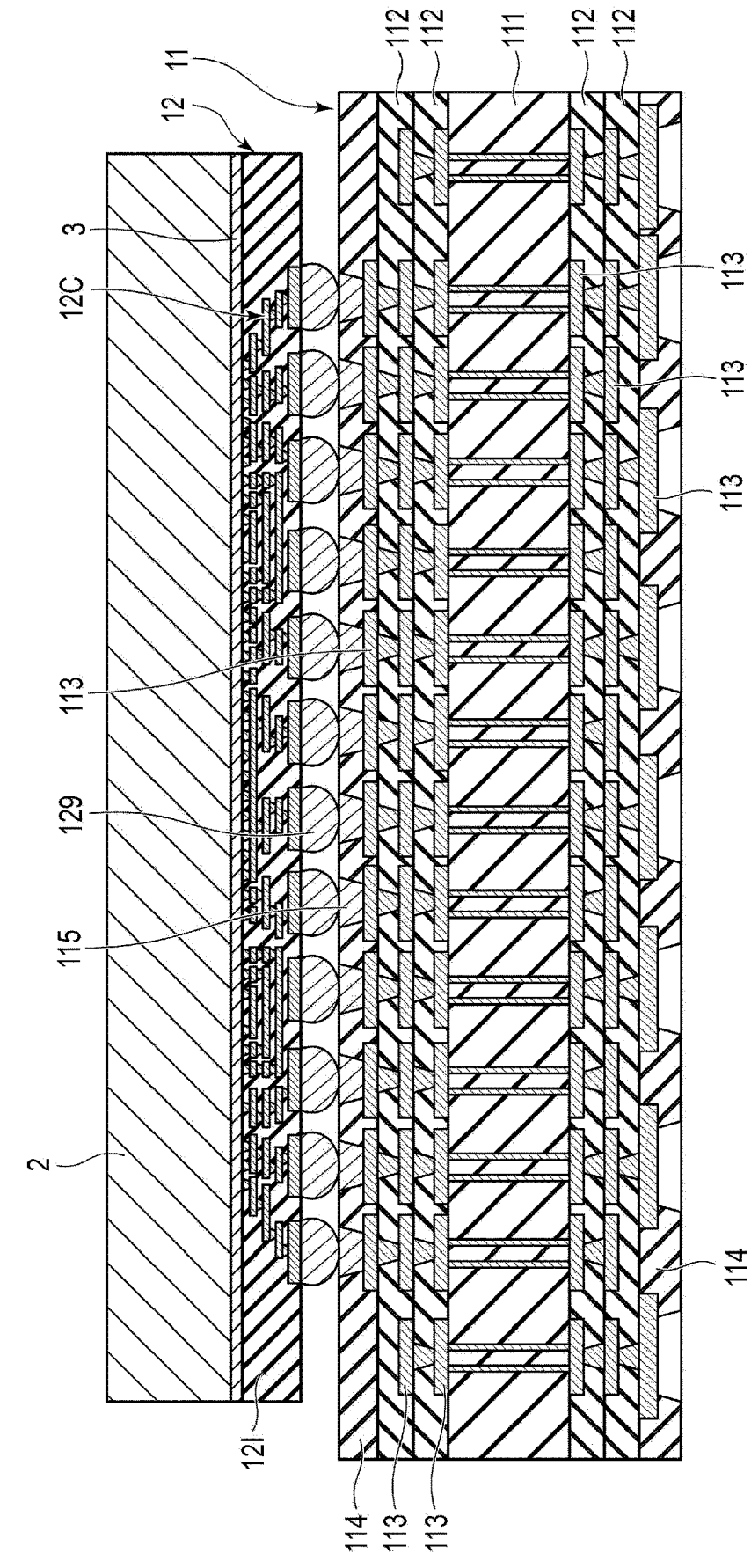
FIG. 6 is a cross-sectional view schematically illustrating still another step in the method of producing the packaged device shown in FIG. 1.

Next, as shown in FIG. 6, the multilayer wiring board 12 supported by the support 2 and an FC-BGA substrate 11 are bonded to each other. The FC-BGA substrate 11 shown in FIG. 6 includes bonding conductors 115. The bonding conductor 115 may be made of solder, for example. The bonding conductors 115 and 129 are bonded to each other to thereby form bonding electrodes 14 shown in FIG. 7.

Figure 7:
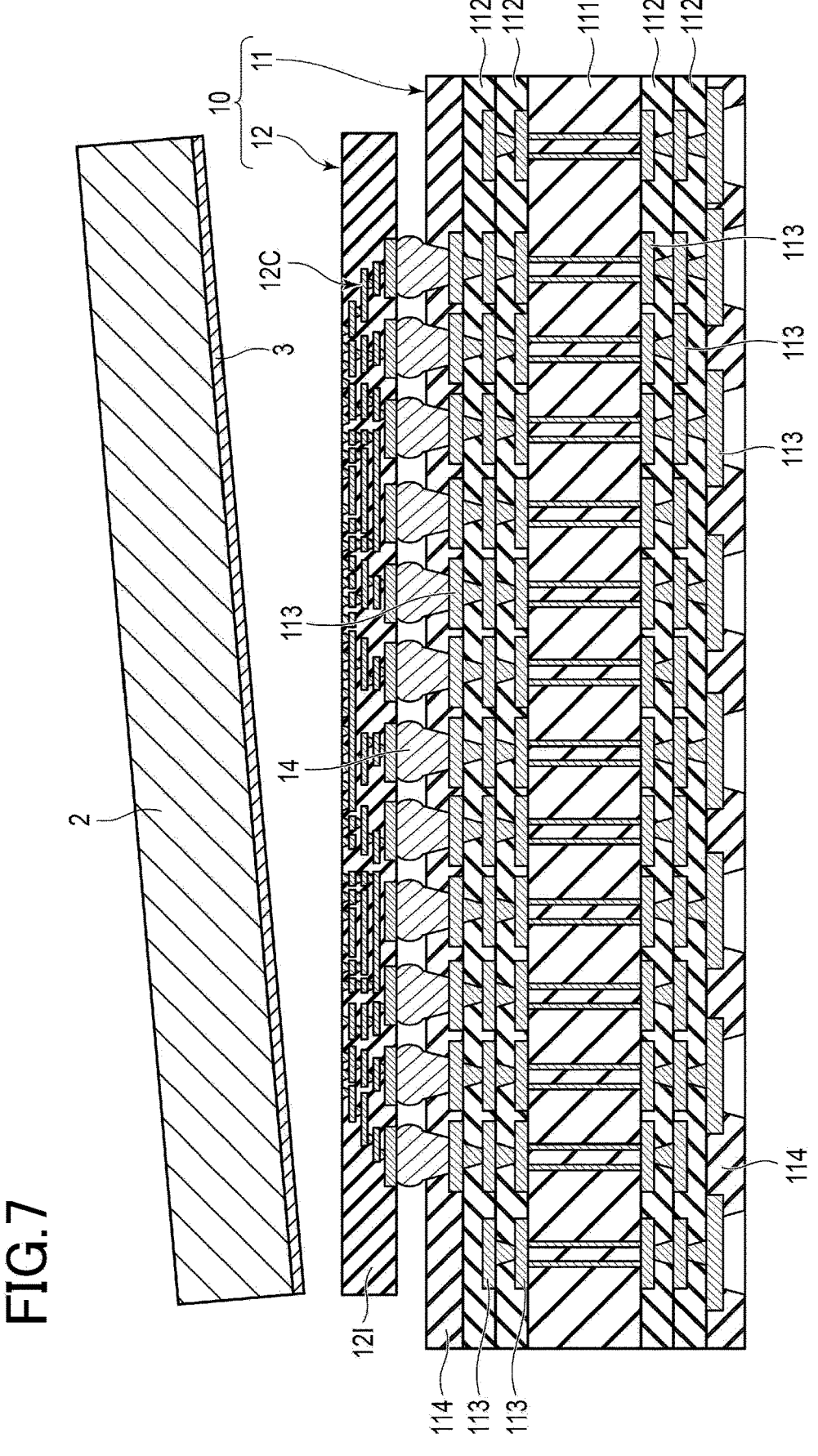
FIG. 7 is a cross-sectional view schematically illustrating still another step in the method of producing the packaged device shown in FIG. 1.

Then, the release layer 3 is irradiated with laser light to separate the support 2 and the multilayer wiring board 12 from each other as shown in FIG. 7. Thus, the multilayer wiring board 12 is transferred from the support 2 to the FC-BGA substrate 11. When the release layer 3 remains on the multilayer wiring board 12, it can be removed by etching, for example.

Figure 8:
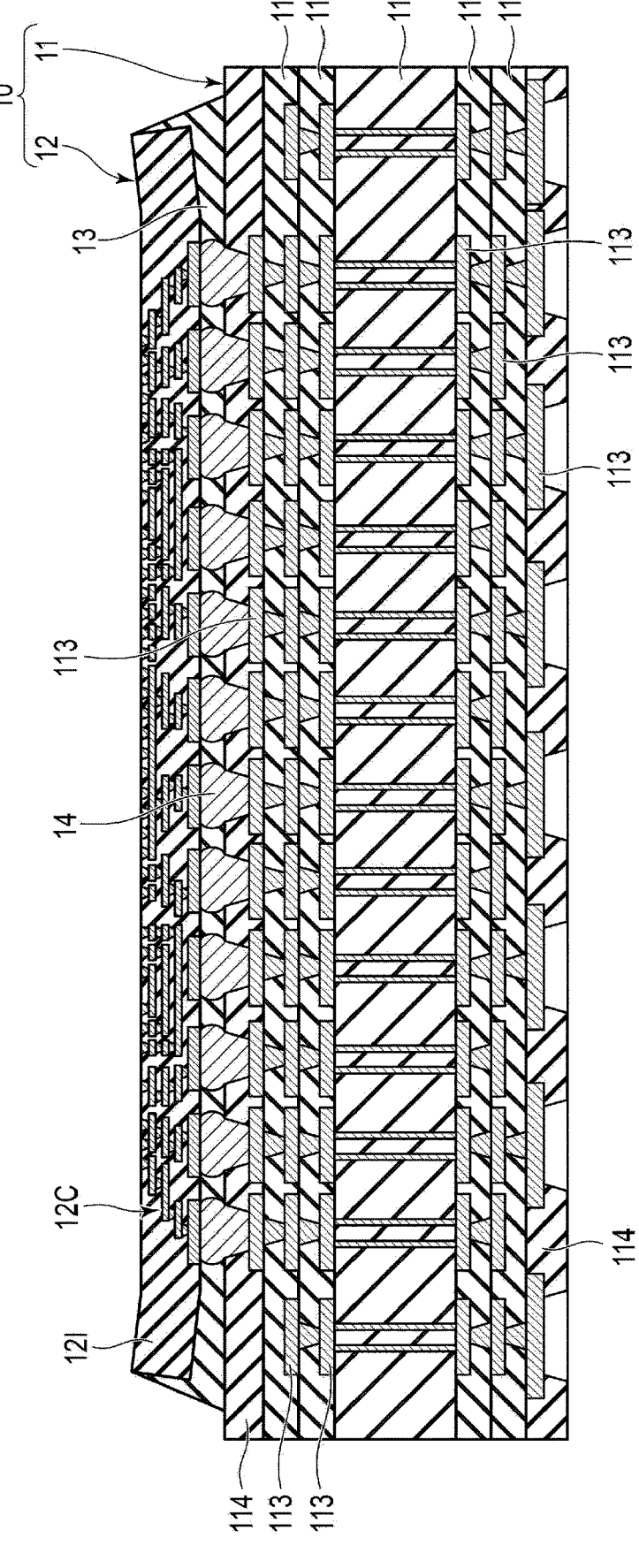
FIG. 8 is a cross-sectional view schematically illustrating still another step in the method of producing the packaged device shown in FIG. 1.

Next, as shown in FIG. 8, a sealing resin layer 13 is formed. In this example, the sealing resin layer 13 is formed after the separation described above, but the separation may be performed after the sealing resin layer 13 is formed.

As a material of the sealing resin layer 13, that is, a sealing resin (or an underfill material), for example, a mixture of resin and filler can be used. The resin can be, for example, one of an epoxy resin, urethane resin, silicone resin, polyester resin, oxetane resin and maleimide resin, or a mixture of two or more thereof. The filler can be, for example, one of silica, titanium oxide, aluminum oxide, magnesium oxide and zinc oxide, or a mixture of two or more thereof.

The sealing resin layer 13 can be formed by, for example, filling a gap between the FC-BGA substrate 11 and the multilayer wiring board 12 with a liquid sealing resin, followed by curing.

Examples of the liquid sealing resin include ones that easily wet the FC-BGA substrate 11 and the multilayer wiring board 12. By using such a sealing resin, the sealing resin, when injected into a gap between the FC-BGA substrate 11 and the multilayer wiring board 12, can spread between the FC-BGA substrate 11 and the multilayer wiring board 12 by capillary action, while covering the end face of the multilayer wiring board 12.

In this process, the sealing resin decreases the area of the surface exposed to the atmosphere. As described above, the peripheral part of the multilayer wiring board 12 is easily bent. Therefore, the sealing resin located outside the peripheral part pushes the peripheral part of the multilayer wiring board 12 upward while migrating into the gap between the peripheral part and the FC-BGA substrate 11. As a result, a structure can be obtained in which the center part of the multilayer wiring board 12 protrudes toward the FC-BGA substrate 11 more than the peripheral part does.

As the sealing resin, an anisotropic conductive film (ACF) or a non-conductive film (NCF) may be used.

That is, first, the FC-BGA substrate 11 and the multilayer wiring board 12 supported by the support 2 are superimposed with the ACF or NCF as the sealing resin interposed therebetween. Then, the FC-BGA substrate 11 and the multilayer wiring board 12 in a superimposed state are pressed against each other to form the sealing resin layer 13 interposed therebetween and covering the end face of the multilayer wiring board 12 to thereby bend the multilayer wiring board 12 and the support 2 so that the center part protrudes toward the FC-BGA substrate 11 more than the peripheral part does. Then, the multilayer wiring board 12 and the support 2 are separated from each other.

When forming the sealing resin layer 13 using the ACF or NCF, a structure can be obtained in which the center part of the multilayer wiring board 12 protrudes toward the FC-BGA substrate 11 more than the peripheral part does by pressing the center part of the multilayer wiring board 12 with a pressure higher than that applied to the peripheral part if the support 2 is easily bent. Alternatively, a structure can be obtained in which the center part of the multilayer wiring board 12 protrudes toward the FC-BGA substrate 11 more than the peripheral part does by using the ACF or NCF having the peripheral part thicker than the center part.

Thus, the composite wiring board 10 including the FC-BGA substrate 11, the multilayer wiring board 12, and the like is obtained.

(4) Production of Packaged Device 1

Figure 9:
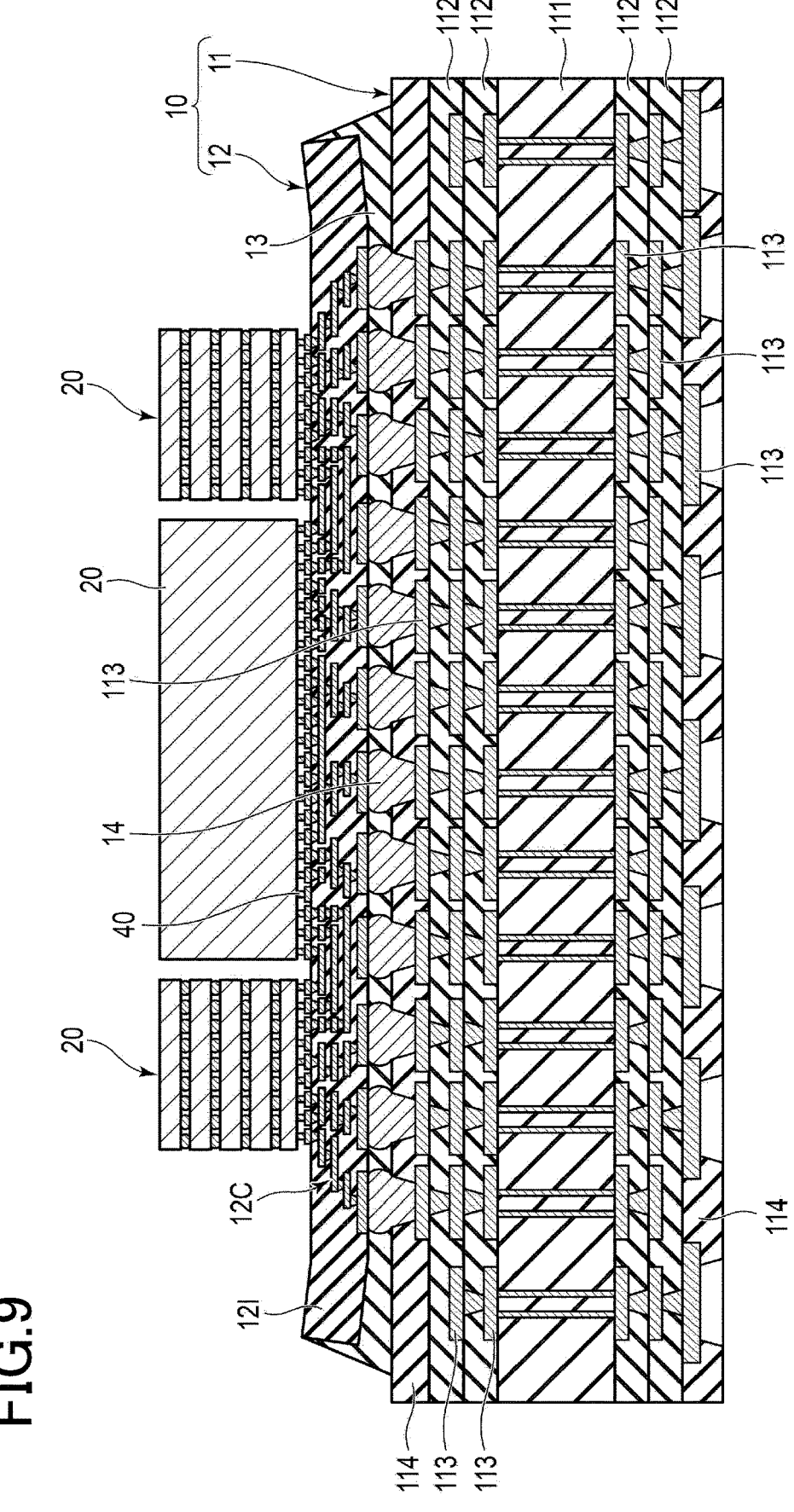
FIG. 9 is a cross-sectional view schematically illustrating still another step in the method of producing the packaged device shown in FIG. 1.

Next, as shown in FIG. 9, a functional device 20 is bonded to the composite wiring board 10. The bonding can be performed by, for example, thermo compression bonding or mount reflow process.

Prior to bonding of the functional device 20, a surface treatment layer such as an electroless Ni/Pd/Au plating layer, an organic solderability preservative (OSP) film, that is, a surface treatment layer with a water-soluble preflux, an electroless tin plating layer or an electroless Ni/Au plating layer may be formed on the exposed portion of the multilayer wiring structure 12C in order to prevent oxidation and improve wettability to solder.

Next, flux cleaning is performed on the bonding portion between the functional device 20 and the composite wiring board 10. Then, the bonding portion is sealed with the sealing resin layer 30 shown in FIG. 1.

As a material of the sealing resin layer 30, for example, the materials exemplified as the materials of the sealing resin layer 13 can be used. The sealing resin layer 30 can be formed by, for example, the same method as that described above for the sealing resin layer 13.

Thus, the packaged device 1 shown in FIG. 1 is completed.

<Modifications>

Figure 10:
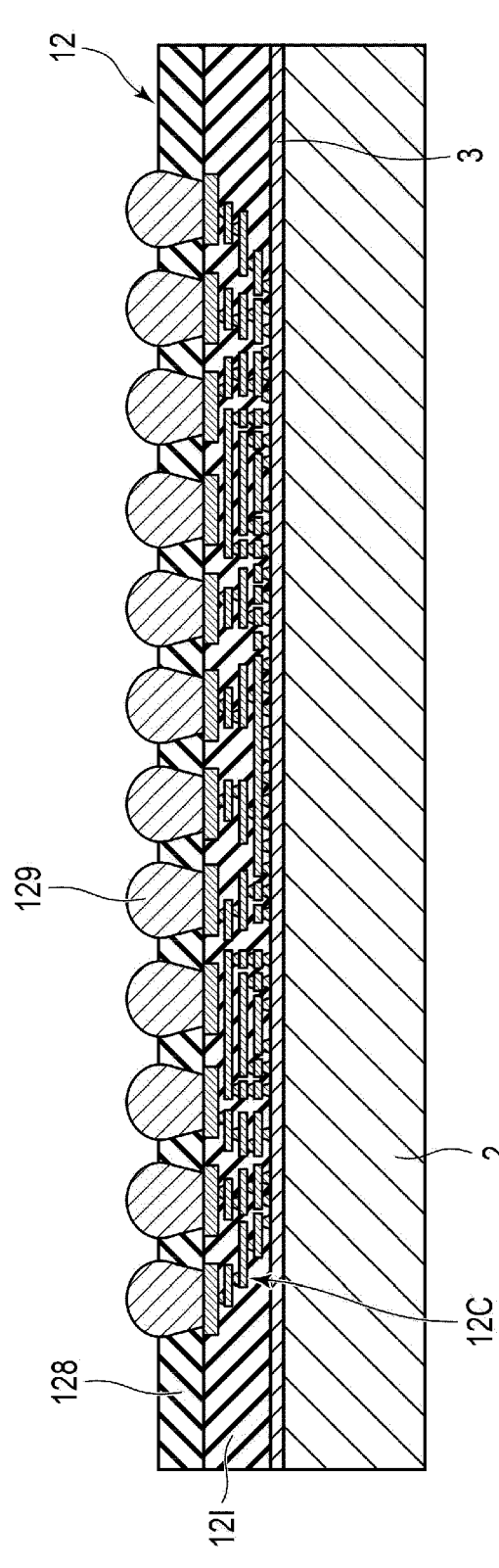
FIG. 10 is a cross-sectional view schematically illustrating a multilayer wiring board with a support used for producing a packaged device according to a modified example.
Figure 11:
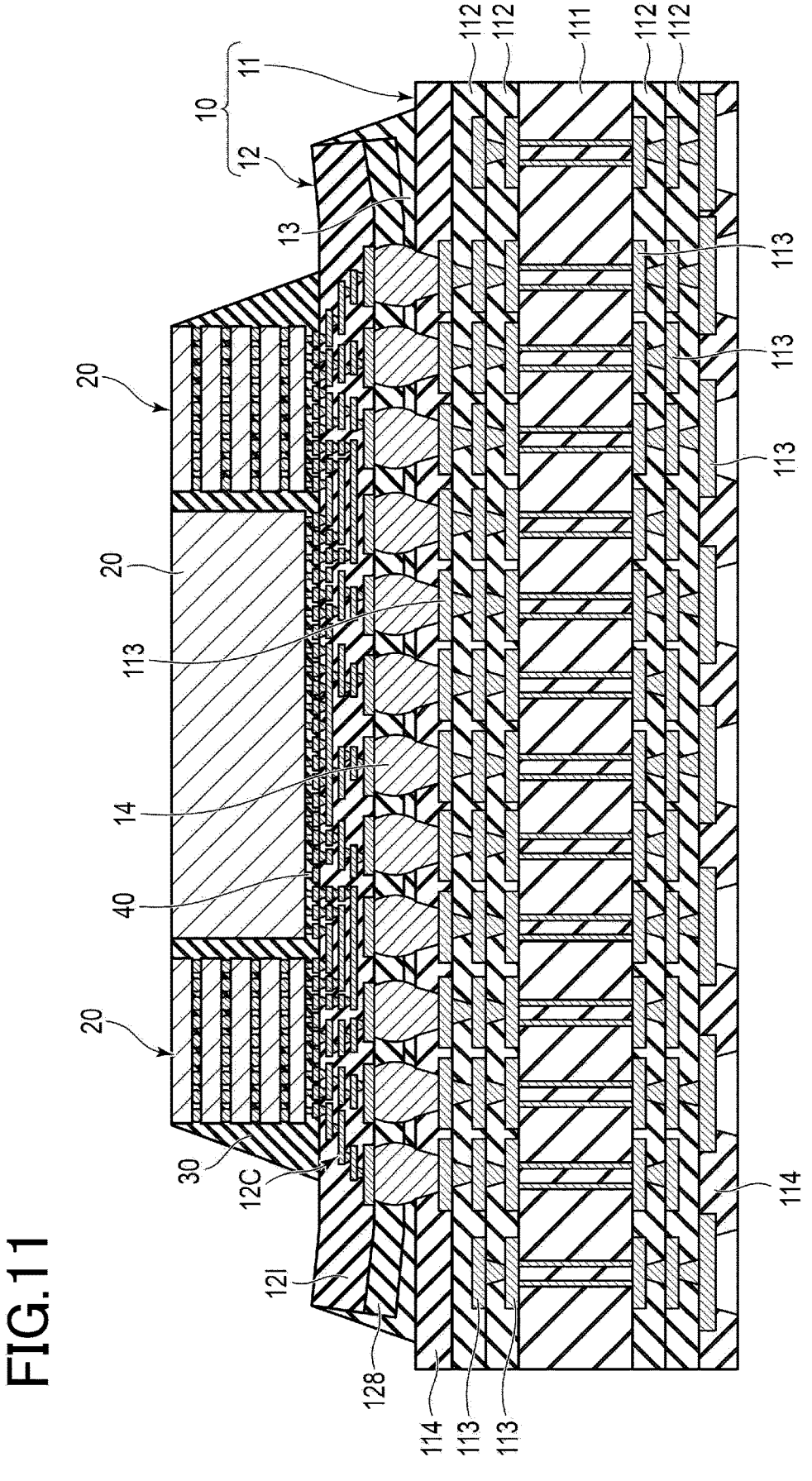
FIG. 11 is a cross-sectional view schematically illustrating a packaged device according to a modified example.

FIG. 10 is a cross-sectional view schematically illustrating a multilayer wiring board with a support used for producing a packaged device according to a modified example. FIG. 11 is a cross-sectional view schematically illustrating a packaged device according to a modified example.

The multilayer wiring board 12 shown in FIG. 10 is the same as the multilayer wiring board 12 described above with reference to FIG. 5 and the like except that a solder resist layer is further included as an insulating layer 128. The packaged device 1 shown in FIG. 11 is the same as the packaged device 1 described above with reference to FIGS. 1 to 9 except that the multilayer wiring board 12 further includes the insulating layer 128.

As shown in the above examples, various modifications can be made to the FC-BGA substrate 11, the multilayer wiring board 12, the composite wiring board 10 and the packaged device 1.

Advantageous Effects

In the above packaged device 1, the functional device 20 is not directly mounted on the FC-BGA substrate 11, but the multilayer wiring board 12 is interposed therebetween. The pitch of the bonding terminals in the multilayer wiring board 12 used for bonding to the FC-BGA substrate 11 can be sufficiently smaller than the pitch of the bonding terminals in the FC-BGA substrate 11 used for bonding to a motherboard. Accordingly, in the multilayer wiring board 12, it is easy to achieve a narrower pitch of the bonding terminals used for bonding to the functional device 20 and finer wiring. Therefore, in the multilayer wiring board 10, it is easy to achieve a narrower pitch of the bonding terminals used for bonding to the functional device 20 and finer wiring.

Interposers obtained by silicon interposer technology, that is, silicon interposers, are manufactured using silicon wafers and semiconductor pre-process equipment. Silicon wafers are limited in shape and size, and the number of interposers that can be manufactured from a single wafer is not always large. Also, the manufacturing equipment is expensive. Therefore, silicon interposers are also expensive. In addition, since the silicon wafer is a semiconductor, the use of a silicon interposer causes a problem of deterioration in transmission performance.

Silicon wafers are not required for production of the above-mentioned composite wiring board 10. Further, for example, all or most of the insulating layers in the composite wiring board 10 can be insulating resin layers. Therefore, the composite wiring board 10 can be manufactured with inexpensive materials and equipment, reducing the cost and achieving excellent transmission performance.

In a technique by which a multilayer wiring structure including conductor layers having a fine wiring pattern are directly formed in an FC-BGA substrate, the deterioration in transmission performance occurring in silicon interposers is small. However, this technique has a problem in the manufacturing yield of the FC-BGA substrate itself. Also, the manufacturing yield as a whole is low since it is difficult to form a multilayer wiring structure including conductor layers having a fine wiring pattern on a core layer such as a glass epoxy substrate. Furthermore, in the FC-BGA substrate, it is difficult to achieve high symmetry relative to a plane bisecting the thickness of the FC-BGA substrate. Accordingly, the FC-BGA substrate tends to warp or distort when heated.

In production of the composite wiring board 10 and the packaged device 1, the multilayer wiring board 12 is produced separately from the FC-BGA substrate 11, and these are bonded to each other. A multilayer wiring structure 12C including conductor layers having a fine wiring pattern is formed not in the FC-BGA substrate 11, but in the multilayer wiring board 12. Since the multilayer wiring board 12 is bonded to the FC-BGA substrate 11 while being supported by the support 2, it can be bonded to the FC-BGA substrate 11 even when it is thin. Therefore, the composite wiring board 10 and the packaged device 1 can be produced with high yield.

Further, in production of the composite wiring board 10, a multilayer wiring structure 12C including conductor layers having a fine wiring pattern is formed not on the core layer such as a glass epoxy substrate, but on the support 2. Since a support having excellent flatness can be used as the support 2, a fine pattern or the like formed thereon can achieve high shape accuracy. For this reason also, the composite wiring board 10 and the packaged device 1 can be produced with high yield.

Moreover, in the composite wiring board 10 and the packaged device 1, it is easy to achieve high symmetry relative to a plane bisecting the thickness of the FC-BGA substrate 11, and it is also easy to achieve high symmetry relative to a plane bisecting the thickness of the multilayer wiring board 12. Furthermore, in the composite wiring board 10 and the packaged device 1, even when the CTE is different between the FC-BGA substrate 11 and the multilayer wiring board 12, warpage or the like due to a difference in CTE is not likely to occur since the FC-BGA substrate 11 and the multilayer wiring board 12 are separately formed and bonded together. Therefore, the composite wiring board 10 and the packaged device 1 are not likely to warp or distort.

The composite wiring board 10 can achieve high connection reliability. This will be described below.

As described above, in the composite wiring board 10, the distance from the multilayer wiring board 12 to the FC-BGA substrate 11 is greater at the peripheral part than at the center part of the multilayer wiring board 12. That is, the sealing resin layer 13 is thicker in the peripheral part of the multilayer wiring board 12 than in the center part of the multilayer wiring board 12. The sealing resin layer 13 covers the end face of the multilayer wiring board 12. Accordingly, the sealing resin layer 13 has an excellent ability to protect the multilayer wiring board 12 from damage. Therefore, the composite wiring board 10 can prevent occurrence of cracking, for example, at the end portions of the multilayer wiring board 12 and achieve high connection reliability.

REFERENCE SIGNS LIST

1 . . . Packaged device; 2 . . . Support; 3 . . . Release layer; 10 . . . Composite wiring board; 11 . . . FC-BGA substrate; 12 . . . Multilayer wiring board; 12C . . . Multilayer wiring structure; 121 . . . Insulating layer; 13 . . . Sealing resin; 14 . . . Bonding electrode; 20 . . . Functional device; 30 . . . Sealing resin; 40 . . . Bonding electrode; 111 . . . Core layer; 112 . . . Insulating layer; 113 . . . Conductor layer; 114 . . . Insulating layer; 120 . . . Layer; 128 . . . Insulating layer; 129 . . . Bonding conductor; 1201 . . . First insulating layer; 1202 . . . Second insulating layer; 1203 . . . Conductor layer; 1203L . . . Land portion; 1203V . . . Via portion; 1203W . . . Wiring portion; 1204a . . . Adhesive layer; 1204b . . . Seed layer.

What is claimed is:

1. A composite wiring board, comprising:
a first wiring board;
a second wiring board facing the first wiring board and bonded to the first wiring board, a distance from the second wiring board to the first wiring board being greater at a peripheral part than at a center part of the second wiring board; and a first sealing resin layer made of a sealing resin interposed between the first wiring board and the second wiring board, the sealing resin layer covering an end face of the second wiring board, wherein a distance D1 from an edge of the surface of the second wiring board 12 facing the first wiring board to a multilayer wiring structure in the second wiring board is 500 μm or more and 700 μm or less, a difference D4 between a distance D2 from the first wiring board to the peripheral part of the second wiring board and a distance D3 from the first wiring board and the center part of the second wiring board is 10 μm or more and 25 μm or less; and the distance D3 is 50 μm or more and 150 μm or less.

2. The composite wiring board of claim 1, wherein the second wiring board is bent with the center part protruding toward the first substrate more than the peripheral part does.

3. The composite wiring board of claim 1, wherein a difference between the distance from the first wiring board to the peripheral part and the distance from the first wiring board to the center part is in a range of 5 μm or more and 30 μm or less.

4. The composite wiring board of claim 1, wherein the second wiring board includes two or more layers laminated together, each of the two or more layers includes an insulating layer made of a material containing an organic insulator, the insulating layer being provided with recesses, and a conductor layer disposed on the insulating layer, the conductor layer filling the recesses.

5. The composite wiring board of claim 4, wherein a distance from an edge of a surface of the second wiring board facing the first wiring board to a multilayer wiring structure formed of the conductor layer included in the two or more layers is 100 μm or more.

6. The composite wiring board of claim 5, wherein the distance from the edge to the multilayer wiring structure is 1,000 μm or less.

7. The composite wiring board of claim 1, wherein the second wiring board has a thickness in a range of 20 μm or more and 100 μm or less.

8. The composite wiring board of claim 1, wherein the peripheral part has a flexural modulus in a range of 1.5 GPa or more and 20 GPa or less.

9. The composite wiring board of claim 1, wherein the first sealing resin layer has a coefficient of linear expansion in a range of 20 ppm/° C. or more and 35 ppm/° C. or less.

10. The composite wiring board of claim 1, wherein the first wiring board is a wiring board for a flip chip ball grid array, and the second wiring board is an interposer.

11. A packaged device, comprising:

the composite wiring board of claim 1;

a functional device mounted on a surface of the second wiring board opposite to that facing the first wiring board; and a second sealing resin layer including a portion interposed between the functional device and the composite wiring board and a portion at least partially covering a side surface of the functional device.

12. A method of producing the composite wiring board of claim 1, the method comprising the steps of:

bonding a first wiring board and a second wiring board facing each other; and injecting a sealing resin into a gap between the first wiring board and the second wiring board to form a sealing resin layer interposed between the first wiring board and the second wiring board and covering an end face of the second wiring board to thereby bend the second wiring board with a center part protruding toward the first wiring board more than a peripheral part does.

13. The method of producing a composite wiring board of claim 12, wherein the step of bonding the first wiring board and the second wiring board includes a step of transferring the second wiring board, which is removably supported by a support, from the support to the first wiring board.

14. A method of producing the composite wiring board of claim 1, the method comprising the steps of:

superimposing a first wiring board and a second wiring board with a sealing resin interposed therebetween; and pressing the first wiring board and the second wiring board in a superimposed state against each other to form a sealing resin layer interposed between the first wiring board and the second wiring board and covering an end face of the second wiring board to thereby bend the second wiring board with a center part protruding toward the first wiring board more than a peripheral part does.

15. The method of producing a composite wiring board of claim 14, wherein the step of superimposing the first wiring board and the second wiring board includes a step of transferring the second wiring board, which is removably supported by a support, from the support to the first wiring board.

16. The composite wiring board of claim 1, wherein the sealing resin is an anisotropic conductive film.

17. The compositive wiring board of claim 1, the sealing resin is a non-conductive film.

* * * * *